United States Patent [19]

Shibayama et al.

[11] 4,367,281

[45] Jan. 4, 1983

[54] FINE FABRICATION PROCESS USING RADIATION SENSITIVE RESIST

[75] Inventors: Kimio Shibayama, Sendai; Kingo Itaya, Tagajyo; Teruo Fujimoto, Nagaoka, all of Japan

[73] Assignee: Toyo Soda Manufacturing Co., Ltd., Yamaguchi, Japan

[21] Appl. No.: 289,281

[22] Filed: Aug. 3, 1981

[30] Foreign Application Priority Data

Jan. 12, 1981 [JP] Japan .................................. 56-2849
Apr. 22, 1981 [JP] Japan ................................. 56-59728

[51] Int. Cl.$^3$ .............................................. G03C 5/00
[52] U.S. Cl. ............................... 430/313; 204/159.22; 430/270; 430/296; 430/323; 526/310
[58] Field of Search ............... 430/270, 296, 313, 323; 526/310; 204/159.22

[56] References Cited

U.S. PATENT DOCUMENTS 3,890,147 6/1975 Monahan .......................... 430/270
4,065,414 12/1977 Seita et al. ......................... 526/310
4,208,211 6/1980 Bowden et al. .
4,286,049 8/1981 Imamura et al. .................. 430/287

OTHER PUBLICATIONS

Itaya et al., Proceedings of the 19th Symposium and Semiconductors and Integrated Circuits Technology; Tokyo, Nov. 26, 1980, Abstract of #7, (p. 42) only.

*Primary Examiner*—Jack P. Brammer
*Attorney, Agent, or Firm*—Oblon, Fisher, Spivak, McClelland & Maier

[57] ABSTRACT

A fine work process comprises forming a thin film made of a radiation sensitive polymer on a board; irradiating radiation; developing and etching the product. The radiation sensitive polymer comprises at least 10 wt. % of a polymer having repeat units:

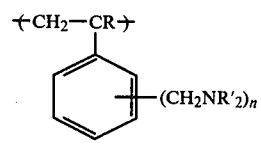

wherein R and R' respectively represent hydrogen atom or an alkyl group and n is an integer of number of substituent groups.

3 Claims, 2 Drawing Figures

FINE FABRICATION PROCESS USING RADIATION SENSITIVE RESIST

BACKGROUND OF THE INVENTION

1. Field of the Invention

The present invention relates to a fine fabrication process using a radiation sensitive resist especially a negative type resist in a production of a semiconductor integrated circuit.

2. Description of the Prior Art

As the etching step in the production of semiconductor integrated circuits, a process for forming an etched pattern by using a light sensitive resin which is sensitive to visible ray and ultraviolet ray (photoresist) has been practically employed. Recently, requirements of higher density and higher integration of devices have been increased to improve reliability and characteristics of the integrated circuits. Thus, special studies for development of ultrafine work technology for circuit patterns have been made. In the studies, a process for forming a circuit pattern having high accuracy by exposure of high energy radiation such as deep ultraviolet rays having short wavelength, X ray and electron beam instead of visible light has been developed. Thus, a development of resist having high functional characteristics sensitive to the radiation has been required. In the production of an integrate circuit, a resist is coated on a substrate to form a film and is exposed by the radiation and is developed to form a fine pattern and the layer having the fine pattern on the substrate is etched to remain the pattern forming part. In the step of the production of the integrated circuit, high sensitivity and high resolution are important as functional characteristics required for the resist. A resist corresponding to fine work accuracy in submicron upto 1 $\mu$m as the resolution is especailly required. Moreover, a wet etching process using a chemical has been employed in an etching process, however a wet etching process is not suitable in view side etching. In the fine work in submicron, a dry etching process by a gas plasma or a reaction sputtering has been newly employed. Thus, excellent material durable to the dry etching is required as the resist. Certain radiation sensitive resists for fine work have been developed. It is quite small to satisfy with all of the above-mentioned requirements. For example, poly(glycidyl methacrylate) (PGMA) has been known as the negative type resist and it has high sensitivity in the order of $10^{-7}$ C/cm$^2$ but has unsatisfactory resolution and has not enough dry etching resistance. On the other hand poly(methyl methacrylate) (PMMA) known as positive type resist has large $\gamma$ value as an index of resolution such as about 2.5 to form a fine pattern in submicron but has a low sensitivy to electron beam in the order of $10^{-4}$–$10^{-5}$ C/cm$^2$ which is lower than a practical sensitivity and has not enough dry etching resistance though it is superior to that of PGMA. The polymers having an aromatic ring in a repeat unit of a polymer which have satisfactory dry etching resistance, have been known, however, these resists are photoresists which have low sensitivity to radiation.

SUMMARY OF THE INVENTION

It is an object of the present invention to provide a fine fabrication process using a negative type radiation sensitive resist which has high sensitivity to radiation and high resolution to form a fine pattern in submicron and has high dry etching resistance.

The foregoing and other objects of the present invention have been attained by providing a fine fabrication process comprising forming a thin film made of a radiation sensitive polymer on a substrate; irradiating radiation; developing and etching the product, an improvement characterized in that said radiation sensitive polymer comprises at least 10 wt. % of a polymer having repeat units;

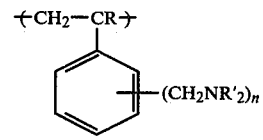

wherein R and R' respectively represent hydrogen atom or an alkyl group and n is an integer of number of substituent groups.

DETAILED DESCRIPTION OF THE PREFERRED EMBODIMENTS

The polymers used as the resist in the present invention have aromatic rings in repeat units of the polymer whereby excellent dry etching resistance is imparted. Moreover, the polymers have aminomethyl or dialkylaminomethyl groups having the formula

as substituents on the aromatic rings whereby excellent sensitivity to radiation is imparted.

The polymers preferably have narrow molecular weight distribution. A polymer having a dispersion factor defined as a ratio of $\overline{M}w/\overline{M}n$ of up to 1.1 preferably up to 1.05 wherein $\overline{M}w$ represents a weigh average molecular weight and $\overline{M}n$ represents a number average molecular weight as substantially a single dispersion can be easily obtained by an anionic polymerization. Thus, a negative type resist for a fine fabrication process having excellent resolution and excellent dimensional accuracy in submicron up to 1 $\mu$m can be obtained.

The polymers used in the present invention comprise at least 10 wt. % preferably 20 wt. % of the above-mentioned repeat units in the polymer.

The polymers are classified into
(i) homopolymers having only one kind of repeat units having the above-mentioned formula and
(ii) copolymers having two or more kinds of repeat units including the repeat units having the above-mentioned formula.

The commoners for the other repeat units in the copolymer (ii) can be desired comonomers including heterocyclic compounds such as vinyl pyridine; styrenes and halogenated styrenes such as styrene, $\alpha$-methylstyrene, chloromethyl styrene, bromomethyl styrene, and halostyrenes; and methacrylates such as glycidyl methacrylate. The molecular weight of the polymer is not critical is preferably at least 5,000 preferably at least 10,000 in view of the molecular weight dependency of the sensitivity to radiation.

Certain productions of resists and certain fine work processes using the same will be illustrated by certain examples.

EXAMPLE 1

Homopolymer of 4-vinylbenzyldimethylamine (4VBDMA) was obtained by a conventional anionic polymerization of a dehydrated, purified 4VBDMA in benzene as a solvent in the presence of sec-butyl lithium as an initiator. The resulting polymer had a molecular weight of $1.7 \times 10^5$ in a measurement by a light-scattering photometer. According to an evaluation of molecular weight distribution by a ultracentrifugation velocity method, a dispersion factor was up to 1.01 to confirm that the polymer had substantially a single dispersion factor.

Figure 1:
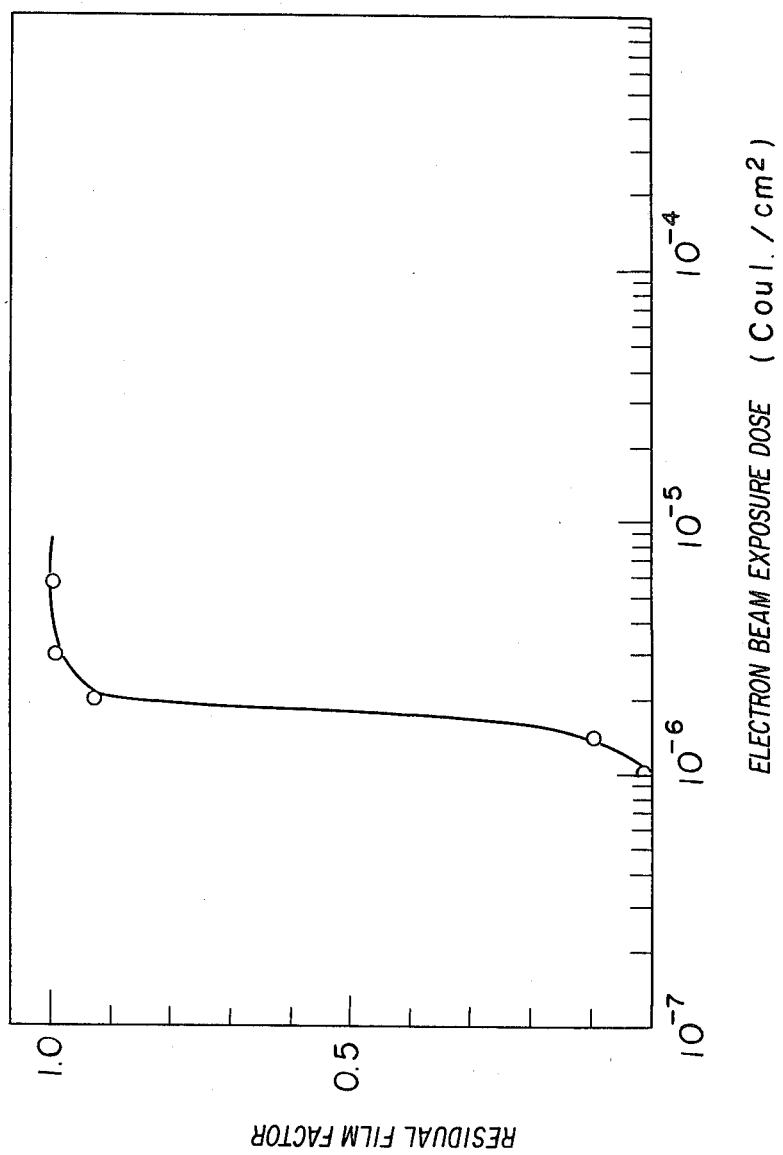
FIG. 1 shows the relation of electron beam exposure doses and residual film factors of the homopolymer of 4VBDMA obtained in Example 1.

The resulting homopolymer of 4VBDMA was used for a fine work as an electron beam resist. The polymer was dissolved in ethylsolve acetate at a concentration of 10 wt. %. The solution was coated at a silicon substrate by a spin coating method to form a uniform layer having a thickness of about 0.6 μm. The product was heated at 100° C. for 30 minutes in vacuum and a pattern was drawn by an electron beam exposure device (acceleration voltage of 20 kV). After the electron beam exposure, it was developed in methyl ethyl ketone-ethanol mixed solvent (1:1 volumetric ratio) for 3 minutes and was rinsed in ethanol. A residual film factor (defined by residual film thickness normarized to initial film thickness) to a electron beam exposure dose (C/cm$^2$) was measured. The result was shown in FIG. 1. A sensitivity is defined by an exposure dose to 0.5 of the residual film factor. In FIG. 1, the sensitivity was $1.6 \times 10^{-6}$ C/cm$^2$ which was 50 times to polystyrene having the same molecular weight.

Figure 2:
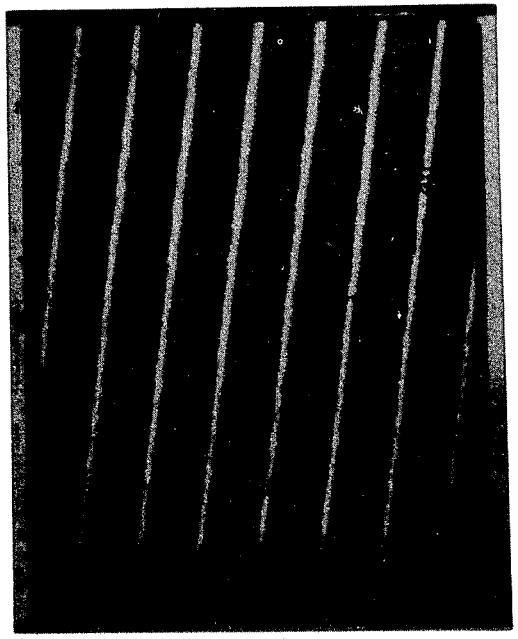
FIG. 2 is an electron microscopic photograph of the fine pattern obtained by using the homopolymer of 4VBDMA obtained in Example 1 (line width of 0.2 $\mu$m; and space of 0.4 $\mu$m).

According to tests of resolutions of the resists by varying a line/space size as patterns drawn by the electron beam, the fine pattern having a line width of 0.2 μm and a space of 0.4 μm was resoluted as shown in FIG. 2 by an electron microscopic photograph.

It is clear that the resist can be utilized for a fine work in submicron. A resolution index calculated from the curve of FIG. 1 is at least 10. This result shows high resolution of the resulting resist.

EXAMPLE 2

In accordance with the process of Example 1, a homopolymer of 4VBDMA having a lower molecular weight and the same formula was produced. The molecular weight was $5.4 \times 10^4$. According to the process of Example 1, the sensitivity and the resolution of the polymer as the electron beam resist were evaluated. The sensitivity was $5 \times 10^{-6}$ C/cm$^2$ and the pattern having a line width of 0.2 μm was formed.

A dry etching resistance of the polymer was tested. A cylindrical plasma reactor (frequency 13.56 MHz and output of 200 W) was used to measure an etching velocity to carbon tetrafluoride reaction gas plasma (5 vol. % of oxygen). As references, etching velocities of polystyrene and poly(methyl methacrylate) were also measured in the same condition. Each etching depth of each polymer film was measured after 15 minutes. As a result, it was 800 Å in the case of the homopolymer of 4VBDMA; 500 Å in the case of polystyrene; and 4000 Å in the case of poly(methyl methacrylate). The etching resistance of the homopolymer of 4VBDMA was slightly lower than that of polystyrene but is 6 to 7 times of that of poly(methyl methacrylate).

The dry etching resistance of the homopolymer of 4VBDMA had not any molecular weight dependency.

EXAMPLE 3

The single dispersion polystyrene obtained by an anionic polymerization (Mw=$1.07 \times 10^5$; Mw/Mn=1.01) was partially chloromethylated by using chloromethyl methyl ether as a chloromethylating agent and stannic tetrachloride as a catalyst (chloromethylation of 54%) and followed by a complete reaction of dimethylamine to obtain a polystyrene having dimethylamino groups on benzene-ring (substitution of 54%).

The property of the polymer as the electron beam resist was measured by the process of Example 1. A sensitivity to the electron beam was $4 \times 10^{-6}$ C/cm$^2$. A fine pattern having a line width of 0.3 μm was formed.

An etching velocity to the plasma of the polymer was measured under the condition of Example 2. As a result, the etching resistance was substantially the same with that of the homopolymer of 4VBDMA.

We claim:

1. In a fine fabrication process comprising forming a thin film made of a radiation sensitive polymer on a substrate; imagewise exposing to radiation; developing and etching the product, an improvement characterized in that said radiation sensitive polymer comprises at least 10 wt. % of a polymer having repeat units:

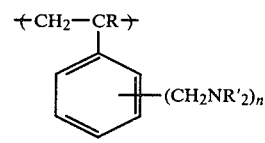

wherein R and R' respectively represent hydrogen atom or an alkyl group and n is an integer of number of substituent groups.

2. The fine work process according to claim 1 wherein said radiation sensitive polymer is a polymer of 4-vinylbenzyldimethylamine.

3. The fine work process according to claim 1 wherein said radiation sensitive polymer is obtained by reacting a polystyrene with a chloromethylating agent followed by reacting dimethylamine.

* * * * *